United States Patent
Leigh et al.

(10) Patent No.: US 10,191,525 B2
(45) Date of Patent: Jan. 29, 2019

(54) MODULES STORING POWER CONFIGURATION PARAMETERS

(71) Applicant: Hewlett Packard Enterprise Development LP, Houston, TX (US)

(72) Inventors: Kevin B. Leigh, Houston, TX (US); Peter Lieber, Houston, TX (US)

(73) Assignee: HEWLETT PACKARD ENTERPRISE DEVELOPMENT LP, Houston, TX (US)

( * ) Notice: Subject to any disclaimer, the term of this patent is extended or adjusted under 35 U.S.C. 154(b) by 78 days.

(21) Appl. No.: 15/221,079

(22) Filed: Jul. 27, 2016

(65) Prior Publication Data

US 2018/0032117 A1 Feb. 1, 2018

(51) Int. Cl.
| G06F 1/26 | (2006.01) |
| G06F 1/30 | (2006.01) |
| G06F 1/18 | (2006.01) |
| G06F 1/32 | (2006.01) |
| G11C 5/02 | (2006.01) |
| G11C 5/06 | (2006.01) |

(52) U.S. Cl.
CPC .............. *G06F 1/266* (2013.01); *G06F 1/189* (2013.01); *G06F 1/30* (2013.01); *G06F 1/3225* (2013.01); *G06F 1/3275* (2013.01); *G11C 5/02* (2013.01); *G11C 5/063* (2013.01)

(58) Field of Classification Search
CPC ........ G06F 1/3202; G06F 1/3231; G06F 1/26; G06F 1/206; G06F 1/3228; G06F 1/08; G06F 1/3289; G06F 1/266; H04L 12/12; H04L 12/10
See application file for complete search history.

(56) References Cited

U.S. PATENT DOCUMENTS

| 5,491,804 | A | * | 2/1996 | Heath | G06F 1/184 710/10 |
| 5,652,893 | A | * | 7/1997 | Ben-Meir | G06F 1/3215 713/300 |
| 6,030,233 | A | | 2/2000 | Kamiyamane | |
| 6,434,652 | B1 | | 8/2002 | Bailis et al. | |
| 6,651,138 | B2 | | 11/2003 | Lai et al. | |
| 6,832,927 | B2 | | 12/2004 | Wilson et al. | |
| 6,889,281 | B2 | | 5/2005 | Burns et al. | |
| 7,533,208 | B2 | | 5/2009 | Strangfeld et al. | |
| 8,896,157 | B2 | | 11/2014 | Huang | |
| 2004/0054936 | A1 | * | 3/2004 | Dwyer, III | G06F 1/26 713/300 |
| 2005/0033997 | A1 | * | 2/2005 | Boynton | H04L 12/10 713/300 |
| 2005/0038986 | A1 | * | 2/2005 | Agan | G06F 9/4411 713/2 |
| 2006/0282594 | A1 | * | 12/2006 | Motoe | G06F 13/409 710/301 |

(Continued)

*Primary Examiner* — Zahid Choudhury

(74) *Attorney, Agent, or Firm* — Hewlett Packard Enterprise Patent Department

(57) ABSTRACT

A method and a device are provided. In an example, the method includes detecting a presence of a module in a socket. Based on detecting the presence of the module, a power configuration parameter stored in a memory of the module is read, and power is applied to an integrated circuit of the module according to the power configuration parameter.

15 Claims, 7 Drawing Sheets

(56) References Cited

U.S. PATENT DOCUMENTS

| | | | |
|---|---|---|---|
| 2011/0314309 A1* | 12/2011 | Hansen | G06F 1/26 713/300 |
| 2012/0246458 A1* | 9/2012 | Jain | G06F 1/3253 713/100 |
| 2013/0166928 A1* | 6/2013 | Yang | G06F 1/266 713/300 |
| 2013/0191654 A1* | 7/2013 | Schlichter | G06F 1/266 713/300 |
| 2015/0340898 A1* | 11/2015 | Schwartz | G06F 1/266 320/103 |

* cited by examiner

single reboot may take considerably longer.

MODULES STORING POWER CONFIGURATION PARAMETERS

BACKGROUND

Computing systems range in complexity from single package or system-on-chip implementations to supercomputers with thousands of interconnected computing nodes. For systems that include discrete circuit components, the individual circuit components may be interconnected by affixing them to printed circuit boards using solder or other relatively permanent techniques. However, for less permanent applications, components may be arranged in a module, such as an expansion card, that couples to a socket. Sockets allow circuit components to be added or removed in order to replace failing parts, to upgrade the computing system, to repurpose the system, and for other purposes. Some systems allow modules to be hot plugged into sockets while power in the computing system is live and may allow a module to be plugged in while the system is operating. This may avoid a shutdown or reboot of the system.

BRIEF DESCRIPTION OF THE DRAWINGS

Certain examples are described in the following detailed description with reference to the drawings, of which.

DETAILED DESCRIPTION OF SPECIFIC EXAMPLES

Figure 2:
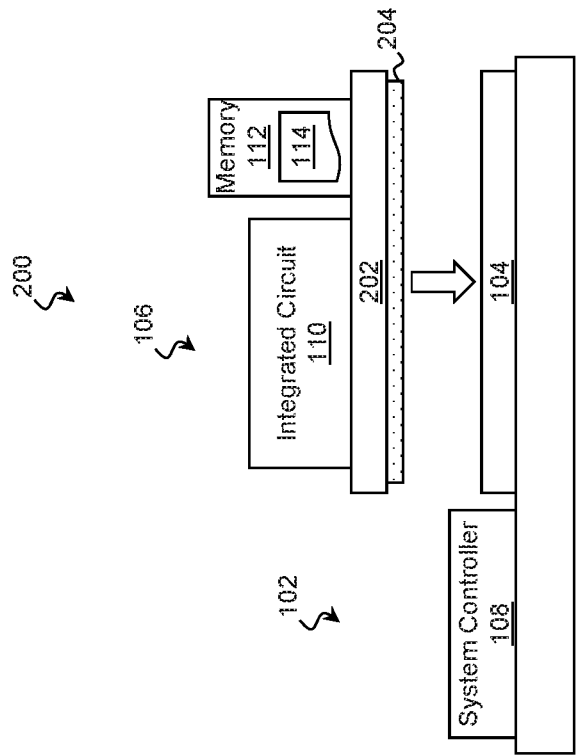
FIG. 2 is a block diagram of a computing environment that includes a module according to some examples of the present disclosure.

In order to allow components of a computing system to be added, removed, and replaced, the associated integrated circuit devices may be arranged on a module such as a card, a carrier, a package, etc. The module may then be physically and communicatively coupled to a corresponding socket of a computing system. Despite advances in sockets, tolerances, and contact alignment, there may still be risk of a power event such as a short or an inrush surge when coupling a module to a socket with live power. Many circuit devices and modules are extremely sensitive to such power events and may not survive. While the risk may be mitigated by fully shutting down the computing system, a power-down-and-reboot sequence may take the system offline for a considerable amount of time. In many applications, this downtime is unacceptable. For example, to achieve five nines availability (99.999% uptime), a system is only permitted to be down for a little over five minutes per year. A single reboot may take considerably longer.

For these reasons and others, it may be desirable to hot plug a module into a computing system while live power is present and potentially while the system is still operating. Some examples of the present disclosure provide a computing system that supports hot plugging of modules into the system. The modules may be interface modules, processor modules, memory modules, storage modules, and/or other suitable modules and may include integrated circuits adapted to the module's particular purpose. To control the supply of power during the initial power-on of the integrated circuits and thereafter, each module may contain a memory that stores a set of power configuration parameters for the module and/or its integrated circuits.

When a system controller detects a module in a socket, it may read the power configuration parameters from the module. This may include supplying nominal power to the module memory in order to read the parameters from the memory. The power configuration parameters may specify aspects of an operating power for the module (separate from any nominal power used to read the parameters). For example, the parameters may specify terminals of the module and socket to use as power/ground terminals, voltages to apply to the terminals, peak currents for the terminals, a sequence for applying the voltages and currents to the terminals, conditions for applying particular voltages and currents, and/or other suitable parameters. The parameters may specify different power configurations for different modes such as wake, sleep, shutdown, etc.

Once the parameters are read, the system controller begins to supply the operating power to the integrated circuit of the module according to the power configuration parameters. In this way, the computing system is able to perform an orderly power-on of the module's integrated circuit and reduce the risk of a power surge during insertion and power-on of the module.

By these mechanisms and others, the present disclosure provides a novel device and technique for controlling power to a module with substantial real world improvements to functionality that resolve several issues pertaining to hot plugging of modules. For instance, by utilizing power configuration parameters stored on the module to which they pertain, in some examples, a system controller and a socket support a wide array of modules with vastly different power configurations. A single socket may support modules with different voltages, different currents, different power terminals, different ground terminals, different voltage sequences, and different conditions for applying power. Furthermore, the system controller and socket may safely power-on the module without having prior knowledge of the module's power-on sequence. Because the power configuration parameters allow systems to support more types of modules, customers may be offered a wider range of system configurations better suited to their individual needs. The power configuration parameters may also allow third-party vendors to design modules for existing systems and may promote interoperability and standardization across vendors.

In some examples, a nominal amount of power is used to read these power configuration parameters that is independent of the operating power used to drive the integrated circuit. The nominal power used to read the power configuration parameters may be significantly less than the operating power and may pose a lower risk to the module if the module is misaligned and lower risk to the system if a foreign object causes a short. Because the operating power is not supplied until the alignment is confirmed, the risk of damage to the module may be reduced.

These and other examples are described with reference to the following figures. Unless noted otherwise, these figures and their accompanying description are non-limiting and no element is characteristic of any particular example. In that regard, features from one example may be freely incorporated into other examples without departing from the spirit and scope of the disclosure.

Figure 1:
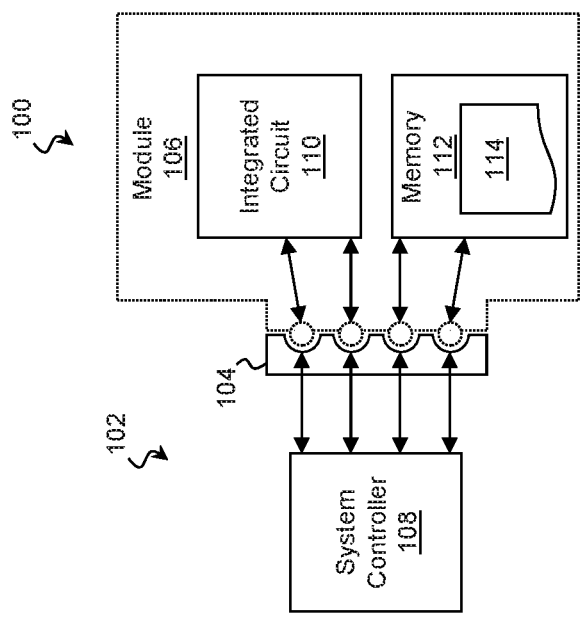
FIG. 1 is a schematic diagram of a computing environment according to some examples of the present disclosure.

FIG. 1 is a schematic diagram of a computing environment 100 according to some examples of the present disclosure. The computing environment 100 includes a computing system 102 with a socket 104 to receive a module 106, and a system controller 108 communicatively coupled to the socket 104. As described in detail below, the system controller 108 may control various aspects of the power supplied to the module 106 via the socket 104 such as the voltage, the current, the order and time at which specific voltages are supplied, and/or other suitable aspects of the supplied power. In this way, the system controller 108 supports a wide range of modules 106, some of which may have complex power-on sequences.

The computing system 102 may couple to the module 106 via any suitable socket 104. In various examples, socket 104 includes a card-edge connector, a land grid array (LGA) socket, a pin grid array (PGA) socket, a plastic leaded chip carrier (PLCC) socket, a dual in-line package (DIP) socket, and/or another suitable socket. The socket 104 releasably couples the module 106 to the remainder of the computing system 102 including the system controller 108 and may communicatively as well as physically couple the module 106. Communicative coupling may include electrical coupling, optical coupling, and combinations thereof. In some examples, the socket 104 is operable to couple the module 106 while the computing system 102 is powered and operating.

The module 106 may represent any suitable device and/or circuit that may be coupled to the computing system 102. In some examples, the module 106 is an interface module for interfacing with a network, a fabric, an I/O bus, and/or any other suitable device. The interface module 106 may support any suitable protocol and in various examples, a network interface module 106 supports Ethernet, Fibre Channel, Fibre Channel over Ethernet (FCoE), and/or other suitable protocols. A storage interface module 106 may support Fibre Channel, FCoE, Serial-Attached SCSI (SAS), Serial ATA (SATA), Non-Volatile Memory Express (NVMe), and/or other suitable protocols. A fabric interface module 106 may support InfiniBand, Gen-Z memory-semantic fabric, Omni-Path Fabric, Cache Coherent Interconnect for Accelerators (CCIX), and/or other suitable protocols. An I/O bus interface module 106 may support PCIe and/or other suitable protocols. A memory interface module 106 may support a Double Data Rate (DDR) protocol such as DDR3 or DDR4 or other suitable protocol.

In some examples, the module 106 is a processing module and includes processing resources such as Central Processing Units (CPUs), System-on-Chip (SOC), Graphics Processing Units (GPUs), microcontrollers, Application-Specific Integrated Circuits (ASICs), Field-Programmable Gate Arrays (FPGAs), and/or other processing resources. A processing module may also include memory such as a cache memory and/or Random Access Memory (RAM). Processing modules may be general purpose or specialized, and in some examples, the module 106 is specialized for graphics, I/O, security tasks such as encryption, and/or other specific tasks. In some examples, a processing module 106 includes circuitry to interface with a network such as Ethernet, a cache coherent fabric such as CCIX, an I/O bus such as PCIe, and/or a specialized GPU interconnect such as NVLink. In some examples, the processing module 106 includes circuitry to interface with a memory-semantic fabric such as Gen-Z.

In some examples, the module 106 is a memory module and includes any amount and type of bulk data memory, such as Dynamic Random Access Memory (DRAM), Static Random Access Memory (SRAM), flash memory, memristor, other types of solid-state memory, and other types of volatile and non-volatile memory.

In some examples, the module 106 is a storage module and includes storage devices such as a Solid State Disk (SSD), a magnetic Hard Disk Drive (HDD), an optical storage device, a tape drive, and/or any other suitable storage device. In some such examples, the storage module 106 includes circuitry to interface with the storage device such as a storage bus controller and/or a storage device controller.

In these examples and others, the module 106 includes integrated circuits 110, of which one is shown. The module 106 may include any suitable integrated circuit 110 and the particular circuit or circuits 110 may depend on the type of the module 106. For an interface module 106, the integrated circuit 110 may include an interface controller, an interface transceiver (e.g., an electrical or optical transceiver), and/or a device controller. For a processing module 106, the integrated circuit 110 may include a processing resource such as a CPU, GPU, microcontroller, ASIC, and/or FPGA. For a memory module 106, the integrated circuit 110 may include memory elements. For a storage module 106, the integrated circuit 110 may include a storage bus interface controller, a storage device controller, and/or a cache. The integrated circuit 110 may also include power devices such as voltage regulators and electronic fuses; and/or passive devices such as resistors, capacitors, inductors, diodes, and other suitable devices.

In order to operate the module 106, the system controller 108 provides power to the integrated circuit 110 and other elements of the module 106 via the socket 104. The integrated circuit 110 may rely on specific voltages and currents being provided on specific terminals and may rely on the voltages and currents being applied in a particular order, particularly at power-on. Accordingly, the module 106 includes a memory 112 that stores power configuration parameters 114 of the module 106 and/or the integrated circuit 110. The power configuration parameters 114 specify various aspects of the module's power configuration such as which terminals of the module 106 or socket 104 are power and/or ground terminals, what operating voltage(s) are to be applied to the power terminals, what the peak current(s) are for the power terminals, what the voltages and currents are applied in response to, what sequence the voltages and currents are to be applied in, and/or other aspects of the power to be supplied. In some examples, the power configuration parameter 114 specifies that a voltage and/or current is to be applied once a condition is met such as receiving a response from the module 106. The response may include asserting or deasserting a signal, setting or clearing a register, and/or any other suitable response. In some examples, the power configuration parameters 114 specify different power configurations for different operating modes of the module 106 such as wake, idle, sleep, shutdown, and other operating modes. The power configuration parameters 114 are stored in the memory 112 of the module 106, which may include any suitable type of memory such as Electronically Erasable Programmable Read-Only Memory (EEPROM), flash memory, other solid-state memory, battery-backed RAM, etc.

Further examples of the computing system 102 and the module 106 are described in the context of FIG. 2. In that regard, FIG. 2 is a block diagram of a computing environment 200 that includes a module 106 according to some examples of the present disclosure. The module 106 and the computing system 102 to which it couples may be substantially similar to those of FIG. 1. For example, the computing system 102 may include a system controller 108 and a socket 104, and the module 106 may include integrated circuits 110 substantially as described above. In some examples, the module 106 is an interface module and the integrated circuit 110 includes an interface controller, an interface transceiver (e.g., an electrical or optical transceiver), and/or a device controller. In some examples, the module 106 is a processing module and the integrated circuit 110 includes processing resources such as CPUs, SOCs, GPUs, microcontrollers, ASICs, and/or FPGAs. In some examples, the module 106 is a memory module and the integrated circuit 110 includes memory elements. In some examples, the module is a storage module and the integrated circuit 110 includes a storage device controller, a storage bus controller, and/or a storage device. In some examples, the integrated circuit 110 also includes power devices and/or passive devices.

The module 106 may include a memory 112, such as EEPROM, flash memory, other solid-state memory, battery-backed RAM, and/or other suitable storage medium, to store a power configuration parameter 114 substantially as described above. In that regard, the power configuration parameter 114 may specify aspects of the power to be supplied to the module 106 and/or the integrated circuit 110. In various examples, the power configuration parameter 114 specifies the power/ground terminals, the operating voltages to be applied to the terminals, the sequence in which to apply the voltages, the conditions for applying voltages, the peak currents the module 106 consumes for given voltages, and/or other aspects of the power to be supplied. The power configuration parameter 114 may specify different power conditions for different operating modes of the module 106.

The memory 112 and the integrated circuit 110 may be physically, electrically, and/or communicatively coupled to a module circuit board 202 or other coupling circuit. The module circuit board 202 may include printed circuit boards (PCBs) that, in turn, include a set of conductive interconnects (e.g., copper, aluminum, tin, silver, gold, and/or lead traces) disposed on an insulator layer (e.g., a layer of glass, fiberglass, resin, polymer, organic substrates, etc.). Each PCB may have any number of layers of conductive interconnects and insulators. In addition to or as a substitute for the conductive interconnects, the module circuit board 202 may include electrical wires, electrical cables, electrical connectors, polymer waveguides, optical fibers, optical connectors, and other suitable structures for communicatively coupling the components.

The module circuit board 202 may have an interface 204 that removably couples to the socket 104. The interface 204 and the socket 104 may be a complimentary pair such as a card-edge interface and a card-edge connector, an LGA package and an LGA socket, a PGA package and a PGA socket, a PLCC interface and a PLCC socket, a DIP package and a DIP socket, and/or other suitable pairs.

Figure 3:
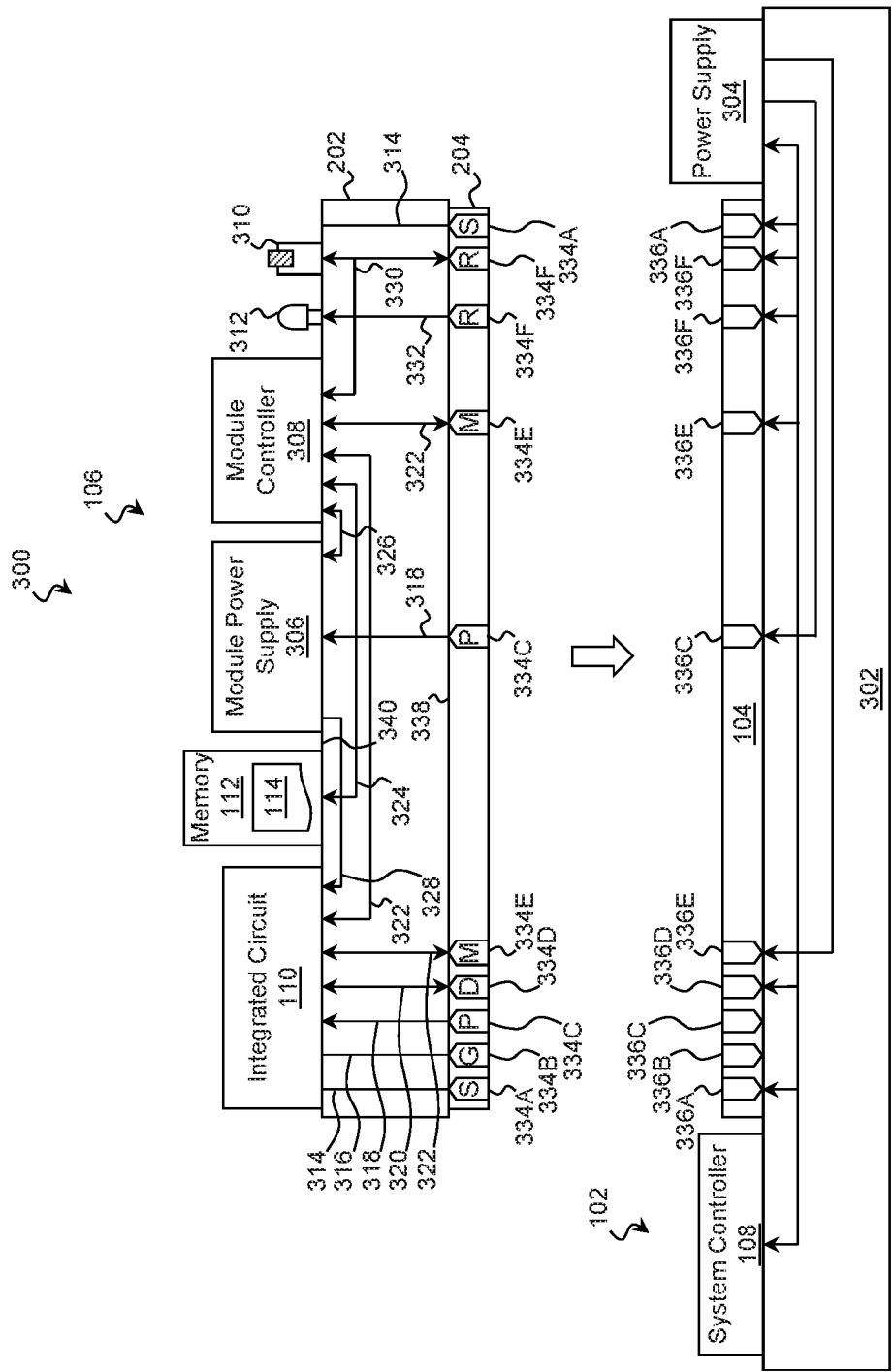
FIG. 3 is a block diagram of a computing environment that includes a computing system with a hot-pluggable module according to some examples of the present disclosure.

Further examples of a suitable computing system 102 and module 106 are described with reference to FIG. 3. FIG. 3 is a block diagram of a computing environment 300 that includes a computing system 102 with a hot-pluggable module 106 according to some examples of the present disclosure. In many aspects, the computing system 102 and the module 106 of FIG. 3 may be substantially similar to those of FIGS. 1 and 2. For example, the computing system 102 may include a socket 104 to receive a module 106 and a system controller 108 communicatively coupled to the socket 104. The system controller 108 and the socket 104 may be disposed on a circuit board 302 that physically and communicatively couples these elements. The circuit board 302 may take the form of PCBs with layers of conductive interconnects disposed on insulator layers. In addition to or as a substitute for the conductive interconnects, the circuit board 302 may include electrical wires, electrical cables, electrical connectors, polymer waveguides, optical fibers, optical connectors, and other suitable structures for communicatively coupling the components.

The computing system 102 may also include a power supply 304 (e.g., a linear voltage regulator, a switching regulator, etc.) to provide operating power to the module 106. The power supply 304 may receive an input voltage and provide output voltages in response to control signals from the system controller 108. The output voltages may be greater than, less than, or equal to the supply voltage, and in some examples, the magnitude of an output voltage may be controlled by the system controller 108. The power supply 304 may be coupled to the socket 104 by the circuit board 302, and in this way, the output voltage(s) are provided to the module 106 and the associated integrated circuit 110.

Turning next to the module 106, it may include an integrated circuit 110 and a memory 112 containing power configuration parameters 114 disposed on a module circuit board 202, each substantially as described above.

In some examples, the module 106 performs power provisioning and configuration tasks in conjunction with the system controller 108 of the computing system 102. Accordingly, the module 106 may include a module power supply 306 and a module controller 308 disposed on the module circuit board 202. Similar to the power supply 304 in the computing system 102, the module power supply 306 may receive an input voltage and provide output voltages to the integrated circuit 110 of the module 106. The output of each module power supply 306 may be controlled by the system controller 108, the module controller 308, or a combination thereof. In this regard, the module controller 308 may operate similar to the system controller 108 in that it may control aspects of the power provided to the integrated circuit 110 based on the power configuration parameter 114. In some examples, the module controller 308 controls the power supplied by the module power supply 306 on the module circuit board 202. Operation of the module controller 308 is described in further detail below. In some examples, the memory 112 that contains the power configuration parameter 114 is physically integrated into the module controller 308.

The module 106 may also include components to assist in removal of the module 106 from the socket 104. In order to safely remove the module 106, in some examples, a removal request signal is provided to the system controller 108 and/or the module controller 308. In some such examples, the module 106 includes a switch 310 disposed on the module circuit board 202 that provides the removal request signal when activated. In some examples, the module controller 308 provides the removal request signal. The removal request signal may cause the system controller 108 and/or the module controller 308 to cease applying operating power to the module 106. The module 106 may also include an removal indicator 312 disposed on the module circuit board 202 that indicates when the operating power has ceased and it is safe to remove the module 106. In some examples, the removal indicator 312 includes a display such as a light-emitting diode (LED) or other display element that indicates this status.

To communicatively couple these elements, the module circuit board 202 includes a set of interconnects such as sense interconnects 314, ground interconnects 316, power interconnects 318, data interconnects 320, power management interconnects 322, memory interface interconnects 324, module power supply control interconnects 326, intra-module power interconnects 328, removal request interconnects 330 and 332, and/or other suitable interconnects. For clarity, only a subset of each type of interconnect are shown, although the module circuit board 202 may contain any number of any type of interconnect. The interconnects may extend between the integrated circuit 110, the memory 112, the module controller 308, the module power supply 306, the switch 310, and/or the removal indicator 312. Some interconnects may couple these elements to terminals 334 (including terminals 334A-334F) of the module circuit board interface 204. In turn, the module's terminals 334 couple the module 106 to the socket 104 via the socket's terminals 336 (including terminals 336A-336F). Module terminals 334 may have designated purposes and examples of suitable terminals 334 include sense terminals 334A, ground terminals 334B, power terminals 334C, data terminals 334D, power management terminals 334E, removal request terminals 334F, and other suitable terminals. The module terminals 334 may couple to corresponding socket terminals including sense terminals 336A, ground terminals 336B, power terminals 336C, data terminals 336D, power management terminals 336E, and removal request terminals 336F.

To minimize interconnect length, simplify routing, and promote signal integrity, module terminals 334 may be directly aligned with their corresponding terminals on the integrated circuit 110, the memory 112, the module controller 308, and/or the module power supply 306. Directly aligning the terminals 334 on the bottom surface 338 of the module circuit board 202 to the components on the top surface 340 of the module circuit board 202 allows for straight-through via routing, and accordingly, in some examples, interconnects, including ground interconnects, power interconnects, and/or data interconnects extend uninterrupted from the top surface 340 to the bottom surface 338 in a direction substantially perpendicular to both surfaces.

Figure 4:
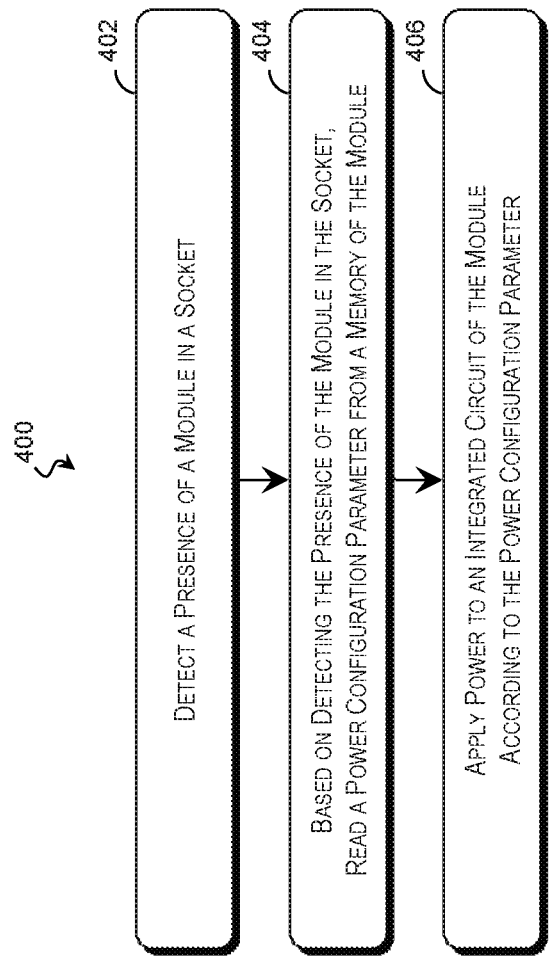
FIG. 4 is a flow diagram of a method of supplying operating power to a module according to some examples of the present disclosure.

When the module 106 is inserted into the socket 104, the system controller 108 reads the power configuration parameter 114 from the memory 112 and supplies operating power to the integrated circuit 110 accordingly. Examples of this technique are described with reference to FIG. 4. In that regard, FIG. 4 is a flow diagram of a method 400 of supplying operating power to a module 106 according to some examples of the present disclosure. It is understood that the description of method 400 is non-limiting, and steps may be added to and omitted from the method 400 without departing from the disclosure. Furthermore, unless noted otherwise, processes of the method 400 may be performed in any order including being performed concurrently by any number of entities. The method 400 is suitable for performing by the computing system 102 of FIGS. 1-3 and/or any other suitable computing system.

Referring first to block 402 of FIG. 4, a system controller 108 or other suitable element of the computing system 102 detects the presence of a module 106 in a socket 104 coupled to the system controller 108. In many examples, the system controller 108 may perform a hot-plug of the module 106 by detecting the presence of the module 106 while operating power to the computing system 102 is live and the computing system 102 is otherwise operating. In these examples and others, operating power to the socket 104 may be disabled until the module 106 is detected to prevent damage when inserting the module 106. This may still allow some nominal power for detecting the module 106. The system controller 108 may utilize any suitable technique to detect the presence of the module 106, and in some examples, the system controller 108 detects a module 106 by detecting an electrical continuity between two or more terminals 336 of the socket 104 indicating that the module 106 is electrically coupled to the terminals. To avoid a false positive when a module 106 is only partially coupled (e.g., misaligned, coupled at an angle, etc.), the terminals used for continuity testing may be disposed at opposite ends of the socket 104, such as sense terminals 336A of FIG. 3. In one such example, continuity is tested between four sense terminals, one at each corner of the socket 104. For a large socket 104, additional sense terminals at other locations (e.g., near the middle of the socket) may be used. Additionally or in the alternative, the system controller 108 may detect the presence of the module 106 using a contact switch or other sensor disposed on or near the socket 104.

Referring to block 404 of FIG. 4, when the module 106 is detected within the socket 104, the system controller 108 or other suitable element reads a power configuration parameter 114 stored in a memory 112 of the module 106. The power configuration parameter 114 may be substantially similar to that of FIGS. 1-3 and may specify aspects of the power to be applied to the module. For example, the power configuration parameter may specify power and/or ground terminals of the module 106 or the socket 104, an operating voltage to be applied to a terminal, a peak current associated with a terminal, a sequence in which to apply voltages and currents, conditions for applying voltages and/or currents, and/or other aspects of the power to be supplied. To read the power configuration parameter 114, a nominal power may be provided to the memory 112 on the module 106, and this may be performed independently of applying operating power to the integrated circuit 110 of the module 106. Because the power configuration parameters 114 may be read without providing operating power to the integrated circuit 110, the risk of damage due to relatively high power events is reduced. The amount of power used to read the power configuration parameters 114 may also be lower than the operating power, further reducing risk to the module 106 if misaligned or to the system if a foreign object causes a short.

Referring to block 406, the system controller 108 or other suitable element applies operating power to an integrated circuit 110 of the module 106 according to the power configuration parameter 114. To do so, the system controller 108 may activate a power supply 304 of the computing system 102 and/or a module power supply 306 of the module 106 to supply the operating power to the integrated circuit 110. This may be done by the system controller 108 alone or in combination with the module controller 308.

Figure 5:
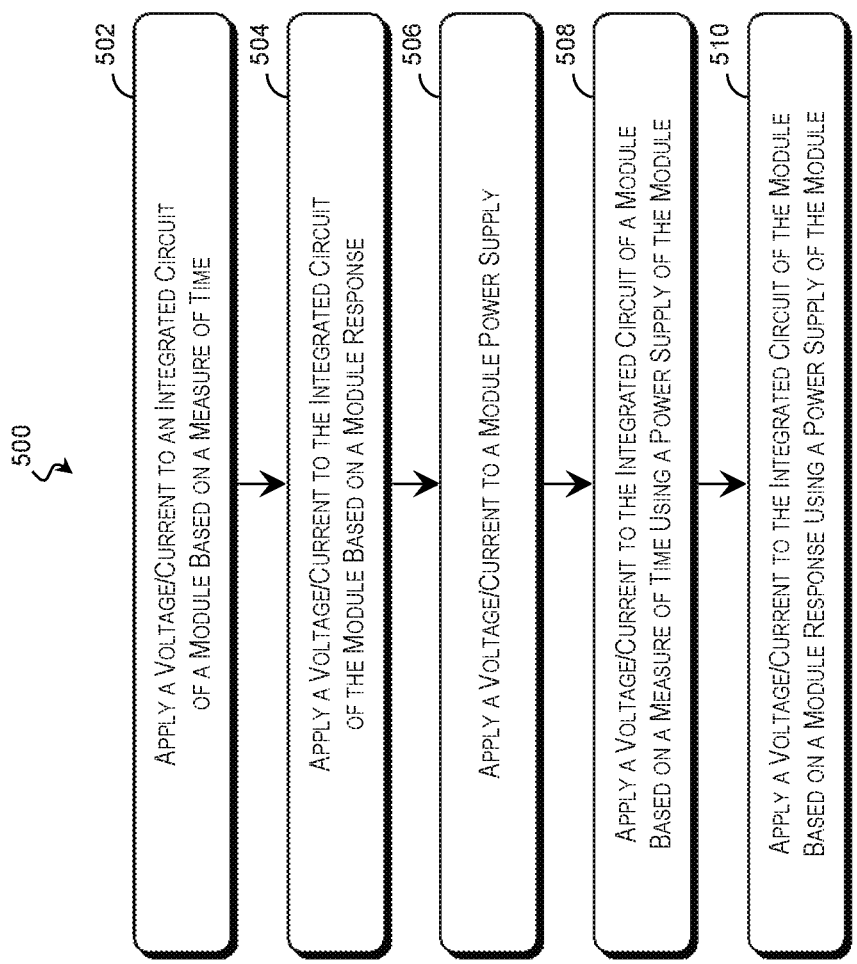
FIG. 5 is a flow diagram of a method of controlling power supplied to a module according to some examples of the present disclosure.
Figure 6:
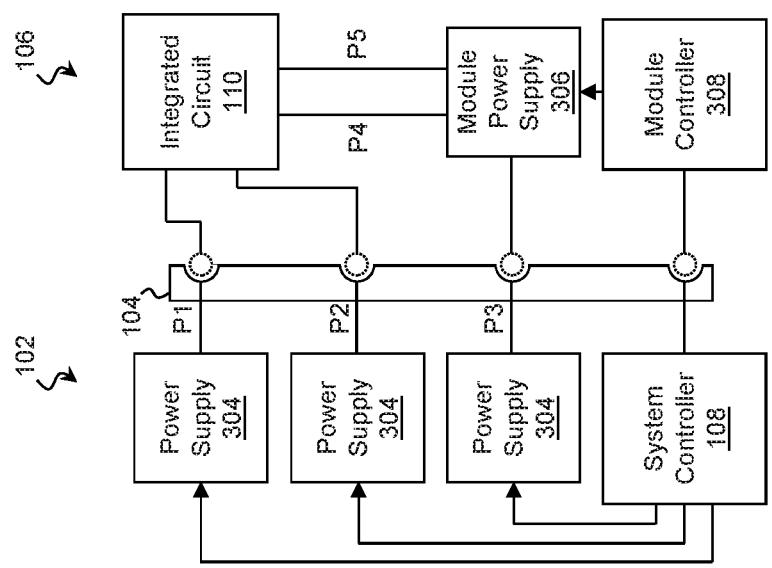
FIG. 6 is a schematic diagram of a computing environment including a computing system and a module according to some examples of the present disclosure.

While the technique for applying the specified voltages to the integrated circuit 110 may depend on the power configuration parameter 114, some examples of the operations of block 406 of FIG. 4 are described in the context of FIGS. 5 and 6. FIG. 5 is a flow diagram of a method of controlling power supplied to a module 106 according to some examples of the present disclosure. It is understood that the description of method 500 is non-limiting, and steps may be added to and omitted from the method 500 without departing from the disclosure. Furthermore, unless noted otherwise, processes of the method 500 may be performed in any order including being performed concurrently by any number of entities. FIG. 6 is a schematic diagram of a computing environment 600 including a computing system 102 and a module 106 according to some examples of the present disclosure. The computing system 102, the module 106, and their respective components may be substantially similar to those of FIGS. 1-3. Accordingly, the method 500 is suitable for performing by the computing system 102 of FIGS. 1-3, 6, and/or any other suitable computing system.

Referring to block 502 of FIG. 5 and to FIG. 6, a system controller 108 controls a first power supply 304 to apply a first voltage and current (designated P1) to an integrated circuit 110 of a module 106 based on a measure of time as specified by a power configuration parameter 114. In some examples, the measure of time is an interval of time since the module 106 was detected in a socket, an interval of time since the power configuration parameter 114 was read, an interval of time since a signal was received, an interval of time since another voltage was provided, and/or any other suitable interval of time. In addition to the measure of time, the first voltage and current may also depend on a signal from the module 106 and/or other conditions.

Referring to block 504 of FIG. 5 and to FIG. 6, the system controller 108 controls a second power supply 304 to apply a second voltage and current (designated P2) to the integrated circuit 110 in response to a signal from a component of the module 106 (e.g., the integrated circuit 110, a module controller 308, etc.) as specified by the power configuration parameter 114. The signal may take any form, and in some examples, the signal is a cleared or set register or an asserted or deasserted signal. In addition to the signal, the second voltage and current may also depend on a measure of time and/or other conditions.

Referring to block 506 of FIG. 5 and to FIG. 6, the system controller 108 controls a third power supply 304 to apply a third voltage and current (designated P3) to a module power supply 306 of the module 106 as specified by a power configuration parameter 114. The third voltage and current may be used as a supply voltage for the module power supply 306 and may be provided in response to a signal from the module 106, a measure of time, and/or other suitable conditions.

Referring to block 508 of FIG. 5 and to FIG. 6, the module controller 308 controls the module power supply 306 to provide a fourth voltage and current (designated P4) to the integrated circuit 110 based on a measure of time as specified by the power configuration parameter 114. As with the first voltage and current, the fourth voltage and current may be supplied in response to any suitable interval of time. In addition to the measure of time, the fourth voltage and current may also depend on a signal from the module 106 and/or other conditions.

Referring to block 510 of FIG. 5 and to FIG. 6, the module controller 308 controls the module power supply 306 to provide a fifth voltage and current (designated P5) to the integrated circuit 110 in response to a signal from a component of the module 106 (such as the integrated circuit 110) as specified by the power configuration parameter 114. As with the second voltage and current, the signal may take any form, and in some examples, the signal is a cleared or set register or an asserted or deasserted signal. In addition to the signal, the fifth voltage and current may also depend on a measure of time and/or other conditions.

As with method 400, the processes of blocks 502-510 may be performed in any order, including concurrently. In addition each block may be repeated more than once with the same or different voltages and the same or different conditions to provide separate independent voltages. By combining the operations of these blocks, the system controller 108 and the socket 104 support a wide array of modules 106 with vastly different power configurations. For example, a single socket 104 may support modules 106 with different voltages, different currents, different power terminals, different ground terminals, different power sequences, and different conditions for applying power. Furthermore, the system controller 108 and socket 104 may safely power-on the module 106 without having prior knowledge of the module's power-on sequence.

Figure 7:
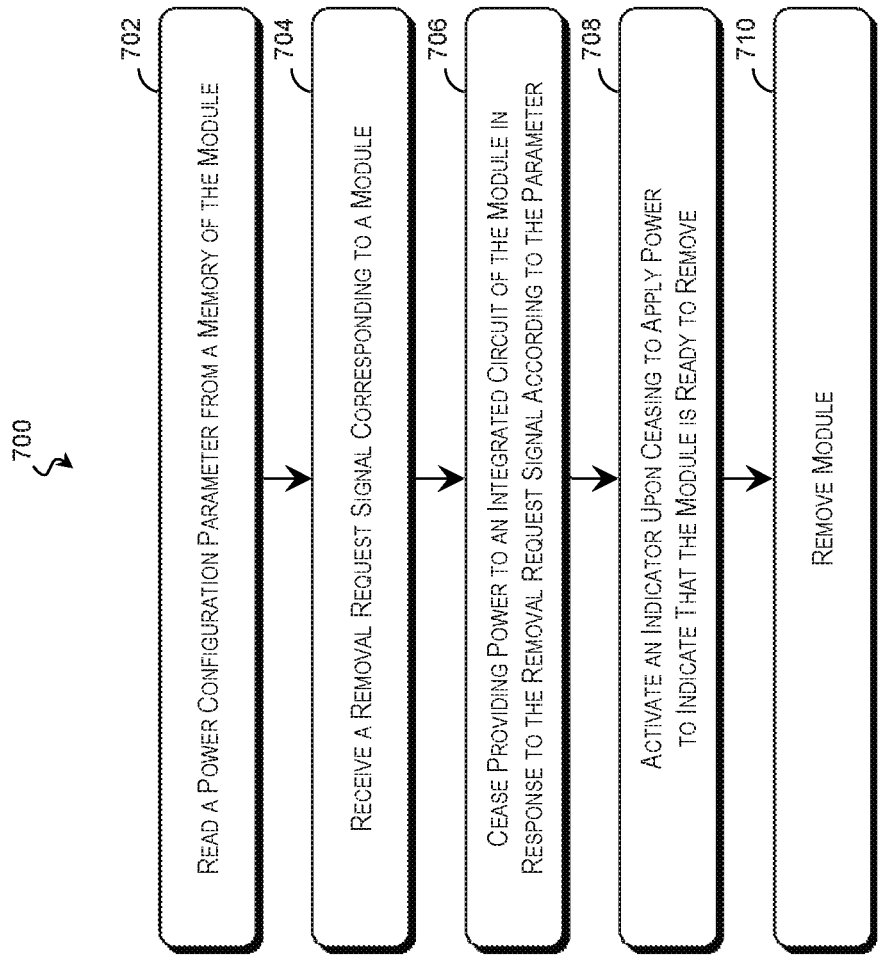
FIG. 7 is a flow diagram of a method of removing a module according to some examples of the present disclosure.

Examples of a technique for removing the module 106 from the socket 104 are described with reference to FIG. 7. FIG. 7 is a flow diagram of a method 700 of removing a module according to some examples of the present disclosure. It is understood that the description of method 700 is non-limiting, and steps may be added to and omitted from the method 700 without departing from the disclosure. Furthermore, unless noted otherwise, processes of the method 700 may be performed in any order including being performed concurrently by any number of entities. The method 700 is suitable for performing by the computing system 102 of FIGS. 1-3, 6, and/or any other suitable computing system.

Referring to block 702, the system controller 108 or other entity of the computing system 102 reads a power configuration parameter 114 stored in a memory 112 of the module 106. The power configuration parameter 114 may be substantially similar to that of FIGS. 1-3 and may specify aspects of ceasing the power applied to the module 106. For example, the power configuration parameter 114 may specify a voltage to be applied to a terminal, a current to supply to a terminal, a sequence in which to cease applying voltages and/or currents, signals or conditions for applying or ceasing power to the module, and/or other aspects of the power to be supplied. A voltage or current provided by the power configuration parameter 114 for use during a power-down of the module 106 may supplement or replace a voltage or current provided during an operational state. For example, the power configuration parameter 114 may specify that a 5V operating voltage supplied to a terminal be reduced to 3V while powering-down the module 106. Reading the power configuration parameter 114 in block 702 may be performed substantially similar to or as part of block 404 of FIG. 4.

Referring to block 704 of FIG. 7, the system controller 108 receives a removal request signal corresponding to a module 106. The removal request signal indicates to the system controller 108 that the module 106 is to be removed and to cease supplying operating power to the module 106. A controlled power-down of the module 106 may avoid interruption of the computing system 102 and may avoid undesirable power events due to shorts when removing the module 106. The removal request signal may be received from the module 106 or any other suitable entity. In an example, the signal is received from a switch 310 such as that of FIG. 3.

Referring to block 706, the system controller 108 ceases providing operating power to the module 106 and the integrated circuit 110 in response to the removal request signal according to the power configuration parameter 114.

The system controller 108 may interact with the power supply 304, the module power supply 306, and/or the module controller 308 to cease the flow of power to the integrated circuit 110 as specified by the power configuration parameter 114.

Referring to block 708, the system controller 108 or other suitable element activates an indicator, such as removal indicator 312 of FIG. 3, to indicate that the flow of operating power to the module 106 has ceased and the module 106 is ready to remove. The module 106 is then removed in block 710.

Figure 8:
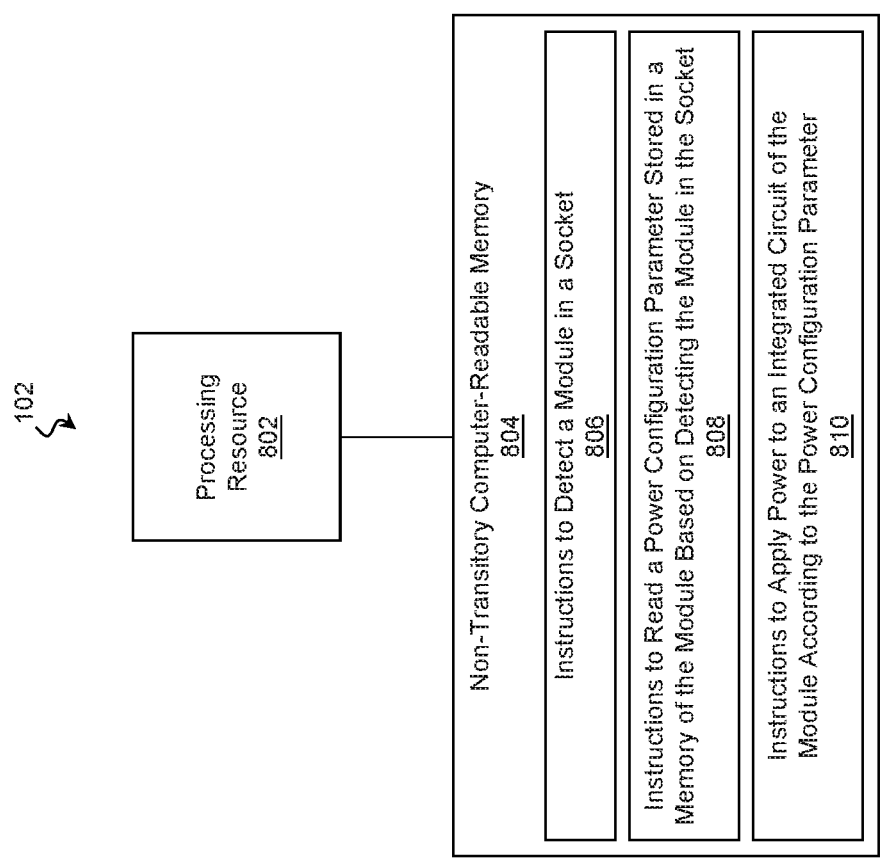
FIG. 8 is a block diagram of a computing system including a non-transitory computer-readable memory resource according to some examples of the present disclosure.

The processes of methods 400, 500, and/or 700 may be performed by any combination of hard-coded and programmable logic. In some examples, a processing resource utilizes instructions stored on a non-transitory computer-readable memory resource to perform at least some of these processes. Accordingly, examples of the present disclosure may take the form of a non-transitory computer-readable memory resource storing instructions that perform at least part of method 400, 500, and/or 700. FIG. 8 is a block diagram of a computing system 102 including a non-transitory computer-readable memory resource according to some examples of the present disclosure. The computing system 102 may be substantially similar to that of FIGS. 1-3 and/or 6.

The computing system 102 may include a processing resource 802 operable to perform any combination of the functions described above. The illustrated processing resource 802 may include any number and combination of CPUs, SOCs, GPUs, microcontrollers, ASICs, FPGAs, and/or other processing resources.

To control the processing resource 802, the computing system 102 may include a non-transitory computer-readable memory resource 804 that is operable to store instructions for execution by the processing resource 802. The non-transitory computer-readable memory resource 804 may include any number of non-transitory memory devices including battery-backed RAM, SSDs, HDDs, optical media, and/or other memory devices suitable for storing instructions.

Referring to block 806, the non-transitory computer-readable memory resource 804 may store instructions that cause the processing resource 802 to detect a presence of a module 106 in a socket 104. This may be performed substantially as described in block 402 of FIG. 4.

Referring to block 808, the non-transitory computer-readable memory resource 804 may store instructions that cause the processing resource 802 to read a power configuration parameter 114 stored in a memory 112 of the module 106 based on detecting a presence of the module 106 in the socket 104. This may be performed substantially as described in block 404 of FIG. 4.

Referring to block 810, the non-transitory computer-readable memory resource 804 may store instructions that cause the processing resource 802 to apply power to an integrated circuit 110 of the module 106 according to the power configuration parameter 114. This may be performed substantially as described in block 406 of FIG. 4.

In the foregoing description, numerous details are set forth to provide an understanding of the subject disclosed herein. However, implementations may be practiced without some or all of these details. Other implementations may include modifications and variations from the details discussed above. It is intended that the appended claims cover such modifications and variations.

What is claimed is:

1. A method comprising:
   detecting a presence of a module in a socket;
   based on detecting the presence of the module, supplying power to a memory of the module while restricting power to an integrated circuit of the module;
   reading information stored in the memory of the module that specifies a power-on sequence for the integrated circuit of the module; and
   applying power to the integrated circuit of the module according to the power-on sequence specified in the information when an alignment of the module with the socket is confirmed.

2. The method of claim 1, wherein the power-on sequence specifies an attribute from a group consisting of a voltage and a current to be applied to the integrated circuit.

3. The method of claim 1, wherein the power-on sequence specifies a sequence of voltages and currents to be applied to the integrated circuit.

4. The method of claim 3, wherein the power-on sequence specifies that applying a voltage and a current of the sequence of voltages and currents to the integrated circuit is conditional on a response of the module.

5. The method of claim 1, wherein the information read from the memory of the module also specifies a terminal of the socket to use to apply the power to the integrated circuit.

6. The method of claim 1, wherein the information read from the memory of the module also specifies a first configuration associated with a first operating mode of the module and second configuration associated with a second operating mode of the module.

7. The method of claim 1, wherein the reading of the information that specifies the power-on sequence includes applying a first voltage to the module; and wherein the applying of the power to the integrated circuit includes applying a second voltage to the module.

8. The method of claim 1, wherein the applying of the power to the integrated circuit includes causing a controller of the module to control a power supply of the module to apply a voltage to the integrated circuit.

9. The method of claim 1 comprising:
   receiving a module removal request signal;
   ceasing to apply power to the integrated circuit in response to the receiving of the module removal request signal according to the power configuration parameter; and
   activating an indicator upon ceasing to apply power to the integrated circuit.

10. A device comprising:
    a socket to receive a module;
    a system controller communicatively coupled to the socket to:
      detect the module releasably coupled to the socket;
      supply power to a memory of the module while restricting power to an integrated circuit when the module is detected;
      read information stored in the memory of the module that specifies a power-on sequence of the integrated circuit of the module; and
      apply power to the integrated circuit of the module according to the power-on sequence specified in the information.

11. The device of claim 10, wherein the power-on sequence specifies a sequence of voltages and currents to apply to the module.

12. The device of claim 11, wherein the power-on sequence specifies that a voltage and a current of the sequence of voltages and currents is conditional on a response of the module.

13. The device of claim 10, wherein the information read from the memory of the module also specifies a terminal of the socket to use to apply power to the module.

14. An integrated circuit device comprising:
an integrated circuit;
a memory to store a power-on sequence to determine an attribute of power supplied to the integrated circuit,
a system controller to:
provide power to the memory resource and restrict power from the integrated circuit when a module circuit board is detected;
read information stored in the memory of the module that specifies the power-on sequence of the integrated circuit of the module; and
apply power to the integrated circuit of the module according to the power-on sequence specified in the information; and
the module circuit board upon which the integrated circuit and memory are disposed, wherein the module circuit board has an interface to removably electrically couple the integrated circuit and the memory to a socket.

15. The integrated circuit device of claim 14, wherein the module circuit board includes an interconnect extending from the integrated circuit to an aligned terminal such that the interconnect extends uninterrupted from a front surface of the module circuit board to a back surface of the module circuit board in a direction perpendicular to the front surface and the back surface.

* * * * *